(12) United States Patent
Chen

(10) Patent No.: US 7,586,078 B2
(45) Date of Patent: Sep. 8, 2009

(54) METHOD FOR FORMING A PHOTOELECTRIC SWITCH

(75) Inventor: Cheng-Fang Chen, Taipei (TW)

(73) Assignee: Lite-On Technology Corp., Taipei (TW)

( * ) Notice: Subject to any disclaimer, the term of this patent is extended or adjusted under 35 U.S.C. 154(b) by 756 days.

(21) Appl. No.: 11/162,955

(22) Filed: Sep. 29, 2005

(65) Prior Publication Data

US 2006/0284347 A1    Dec. 21, 2006

(30) Foreign Application Priority Data

Jun. 20, 2005    (TW)    ............................... 94120456 A

(51) Int. Cl.
*H03K 17/78* (2006.01)
(52) U.S. Cl. ............................. 250/214 SW; 250/226; 250/239; 250/231.1
(58) Field of Classification Search .......... 250/214 SW, 250/221, 226, 239, 231.1
See application file for complete search history.

(56) References Cited

U.S. PATENT DOCUMENTS

| | | | |
|---|---|---|---|
| 6,011,254 A * | 1/2000 | Sano et al. | ............... 250/231.1 |
| 6,184,521 B1 * | 2/2001 | Coffin et al. | ............ 250/237 R |
| 2006/0241358 A1 * | 10/2006 | Al-Ali et al. | ................ 600/301 |

FOREIGN PATENT DOCUMENTS

CN    2523009 Y    11/2002

* cited by examiner

*Primary Examiner*—Stephen Yam
(74) *Attorney, Agent, or Firm*—Kile Goekjian Reed & McManus PLLC

(57) ABSTRACT

A method for forming a photoelectric switch is disclosed. The method includes providing a granular mold having a first slot and a second slot; filling the first and the second slots with a light-filtering molding material; respectively positioning a transmitter component and a receiver component into the light-filtering molding material(s) in the first and the second slots; and solidifying the light-filtering molding material to fix the transmitter component and the receiver component in the granular mold.

10 Claims, 8 Drawing Sheets

METHOD FOR FORMING A PHOTOELECTRIC SWITCH

BACKGROUND OF THE INVENTION

1. Field of the Invention

The present invention relates to a method for forming a photoelectric component, and more specifically, to a method for forming a photoelectric switch.

2. Description of the Prior Art

Please refer to FIG. 1 and FIG. 2. FIG. 1 is a diagram of individual components of a conventional photoelectric switch 10. FIG. 2 is a diagram of the components shown in FIG. 1 being assembled. As shown in FIG. 1, the photoelectric switch 10 comprises a plastic shell 12, a transmitter component 14 and a receiver component 16. The transmitter component 14 comprises a transmitting unit 18, a pair of conducting wires 15a, 15b and a plastic shell 21. The receiver component 16 comprises a receiving unit 19, a pair of conducting wires 17a, 17b and a plastic shell 22. The photoelectric switch 10 shown in FIG. 2 is formed by manually placing the transmitter component 14 and the receiver component 16 into the plastic shell 12. However, a large amount of time and labor is necessary for the above-mentioned manual assembling process. In addition, the size of the photoelectric switch 10 must not be too small because the above-mentioned assembling process is manually performed. In other words, if the size of the transmitter component 14, the receiver component 16 or the plastic shell 12 is too small, the assembling process may not be easily carried out manually. Another feature is that the plastic shell 12 of the conventional photoelectric switch 10 is further utilized for providing a masking function of preventing the photoelectric switch 10 from being affected by external light. For this reason, the plastic shell 12 is usually black and cannot be changed to other light colors.

SUMMARY OF THE INVENTION

One of the objectives of the claimed invention is therefore to provide a method for forming a photoelectric switch, in order to solve the above-mentioned problem.

According to the claimed invention, a method for forming a photoelectric switch is disclosed. The method comprises providing a granular mold having a first slot and a second slot; filling the first and the second slots with a light-filtering molding material(s); respectively positioning a transmitter component and a receiver component into the light-filtering molding material(s) in the first and the second slots; and solidifying the light-filtering molding material to fix the transmitter component and the receiver component in the granular mold.

The transmitter component and receiver component of the photoelectric switch according to the claimed invention do not have their own shells and are both fixed in a shell of the photoelectric switch by an automatic forming process. Therefore, from the method for forming a photoelectric switch according to the present invention, the forming process of the photoelectric switch can be simplified, and a large amount of photoelectric switches can be automatically produced by the present invention method. The costs of labor and time and the cost of shell material(s) can be significantly reduced. Additionally, the size of the photoelectric switch formed by the automatic assembling process can become smaller. Moreover, the function of filtering out visible light in the photoelectric switch of this invention is provided by the light-filtering molding material (comprising a light-filtering agent), and not by the shell of the photoelectric switch. In this way, by an appropriate selection of a light-filtering agent, the color of the shell of the photoelectric switch according to the present invention is not limited to black.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
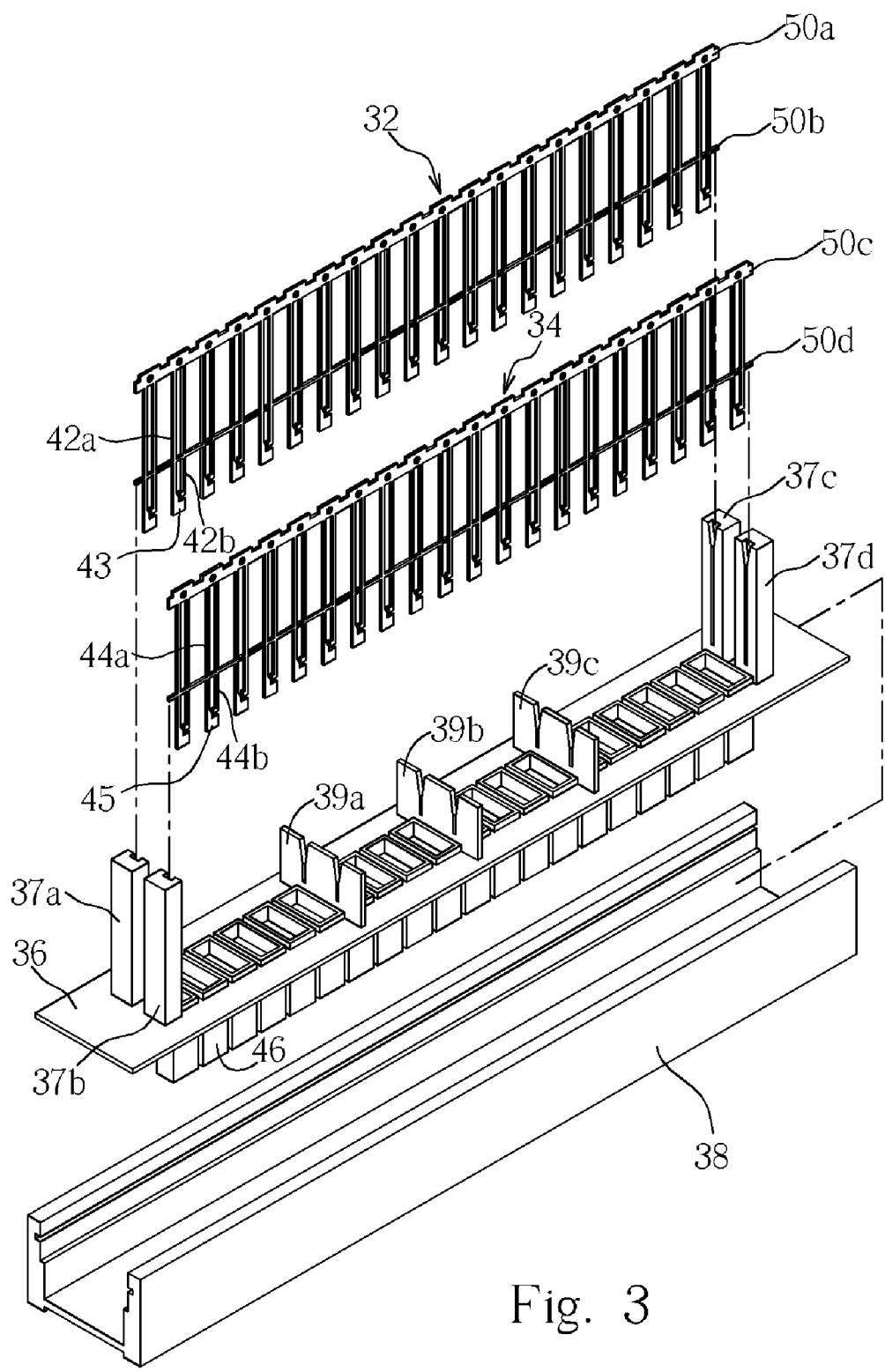
FIG. 3 is a diagram of necessary components for forming a photoelectric switch according to the present invention.
Figure 4:
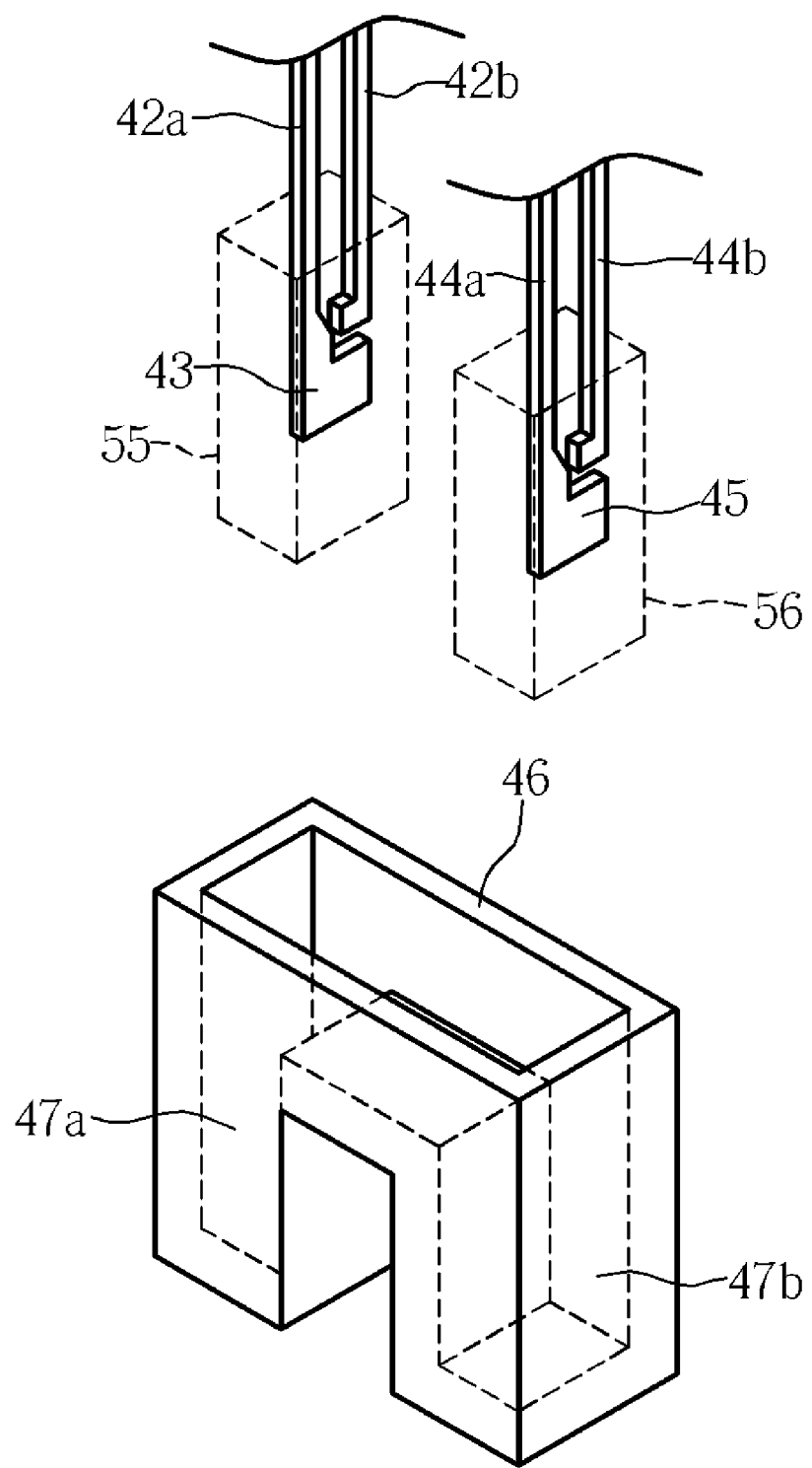
FIG. 4 is an enlarged diagram of a granular mold, a transmitting unit and a receiving unit shown in FIG. 3.

Please refer to FIG. 3 and FIG. 4. FIG. 3 is a diagram of necessary components for forming a photoelectric switch according to the present invention. FIG. 4 is an enlarged diagram of a granular mold 46, a transmitting unit 43 and a receiving unit 45 shown in FIG. 3. As shown in FIG. 3, there are conducting wire frames 32 and 34, a granular mold strip 36 and a holder 38. The conducting wire frame 32 comprises a plurality of transmitting units 43 which are already die-bonded and wire-bonded, a plurality of pairs of conducting wires 42a and 42b, and two support bars 50a and 50b. Each pair of conducting wires 42a and 42b is coupled to a corresponding transmitting unit 43. A transmitter component 55 is composed of a transmitting unit 43 and a corresponding pair of conducting wires 42a, 42b. In addition, by the positioning function provided by the support bars 50a and 50b (to be detailed in the following), a distance between each transmitting unit 43 and each pair of conducting wires 42a, 42b can be fixed.

The conducting wire frame 34 comprises a plurality of receiving units 45 which are already die-bonded and wire-bonded, a plurality of pairs of conducting wires 44a and 44b, and two support bars 50c and 50d. Each pair of conducting wires 44a and 44b is coupled to a corresponding receiving unit 45. A receiver component 56 is composed of a receiving unit 45 and a corresponding pair of conducting wires 44a, 44b. Similarly, by the positioning function provided by the support bars 50c and 50d (to be detailed in the following), a distance between each receiving unit 45 and each pair of conducting wires 44a, 44b can be fixed.

As shown in FIG. 3, the granular mold strip 36 comprises a plurality of granular molds 46 and a plurality of brackets 37a, 37b, 37c, 37d, 39a, 39b, and 39c. The holder 38 is utilized for positioning the above-mentioned granular mold strip 36. Each granular mold 46 comprises two slots 47a and 47b as shown in FIG. 4. It should be noted that in the present embodiment, each granular mold 46 is a plastic one; however, forming the granular mold 46 by other materials is also applicable and is covered by the present invention.

Figure 5:
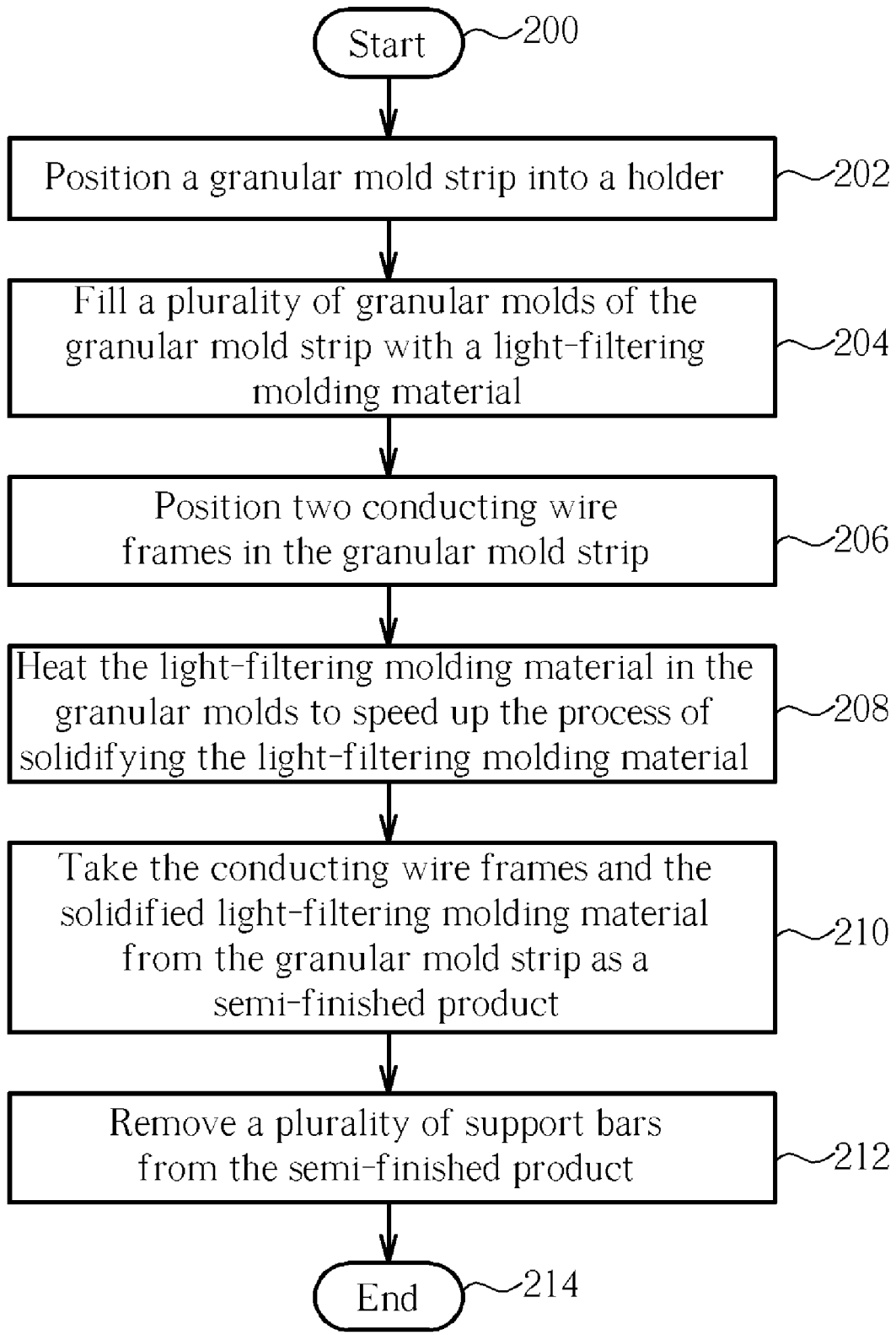
FIG. 5 is a flowchart of forming a photoelectric switch according to the present invention.

Please refer to FIG. 5. FIG. 5 is a flowchart of forming a photoelectric switch according to the present invention. An operation of forming a photoelectric switch comprises the following steps:

Step 200: Start.

Step 202: Position the granular mold strip 36 into the holder 38.

Step 204: Provide a light-filtering molding material and fill the plurality of granular molds 46 of the granular mold strip 36 with the light-filtering molding material.

Step 206: Position the conducting wire frames 32, 34 in the granular mold strip 36.

Step 208: Heat the light-filtering molding material in the granular molds 46 to speed up solidification of the light-filtering molding material.

Step 210: Take the conducting wire frames 32, 34 and the solidified light-filtering molding material from the granular mold strip 36 as a semi-finished product.

Step 212: Remove the support bars 50a, 50b, 50c, and 50d from the semi-finished product to form the desired photoelectric switch.

Step 214: End.

Figure 6:
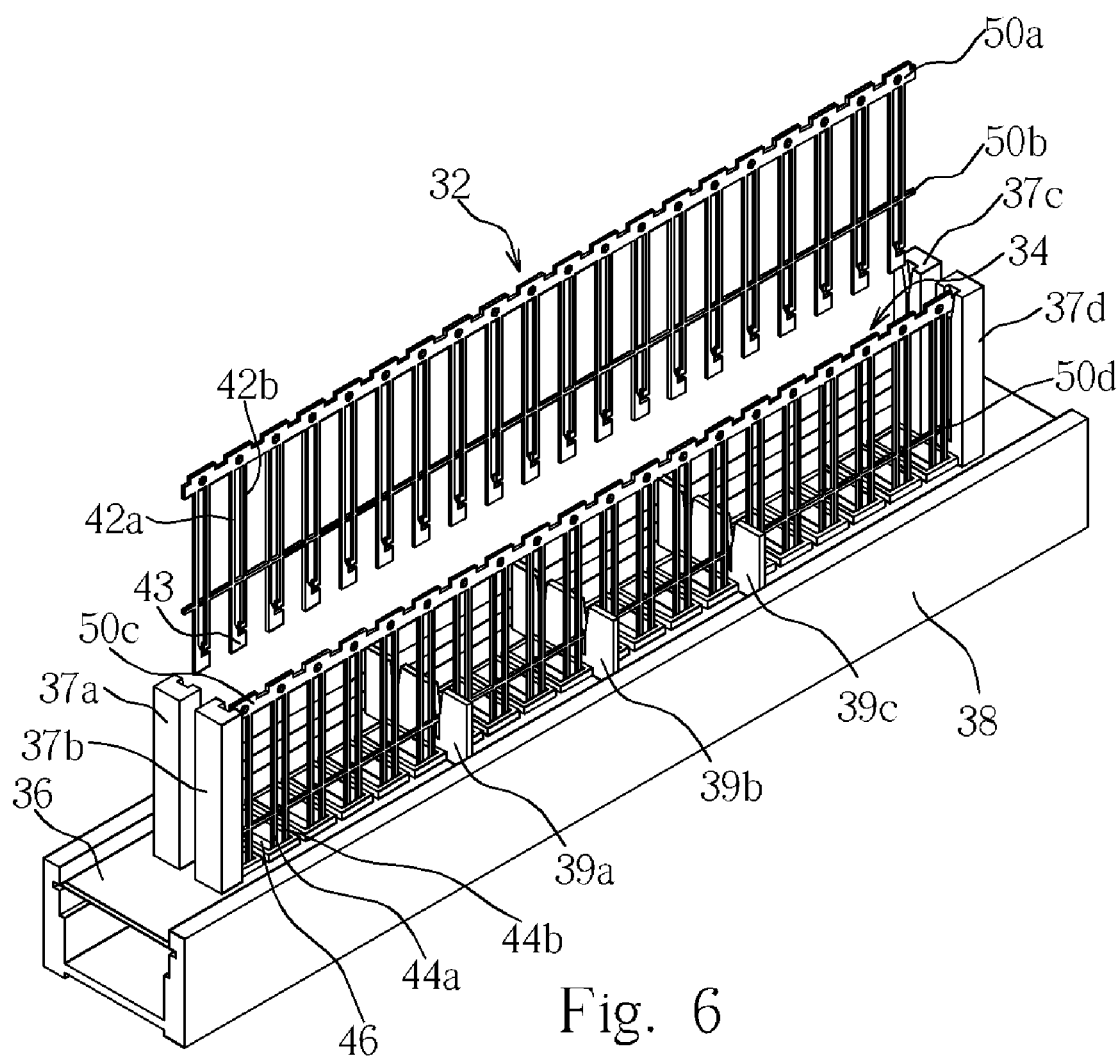
FIG. 6 is a diagram describing a conducting wire frame positioned in a granular mold strip shown in FIG. 3.

A detailed operation flow of the method for forming a photoelectric switch according to the present invention is described as follows. After starting the flow (step 200), the granular mold strip 36 is positioned into the holder 38 (step 202). Next, the granular molds 46 of the granular mold strip 36 are filled with the light-filtering molding material (step 204). In the present embodiment, the light-filtering molding material is a fluid and comprises an epoxy resin and a light-filtering agent to filter out visible light, in order to prevent the transmitting unit 43 and the receiving unit 45 from being affected by visible light. Afterwards, the conducting wire frame 34 is positioned into the granular mold strip 36 filled with the light-filtering molding material. Please refer to FIG. 6. FIG. 6 is a diagram describing the conducting wire frame 34 positioned in the granular mold strip 36. As shown in FIG. 4, each pair of conducting wires 44a, 44b of the conducting wire frame 34 is partially put into a corresponding slot 47b and each receiving unit 45 is entirely put into the corresponding slot 47b, where the corresponding slot 47b is filled with the light-filtering molding material. The conducting wire frame 32 is then positioned in the granular mold strip 36. In the same manner, as shown in FIG. 4, each pair of conducting wires 42a, 42b of the conducting wire frame 32 is partially put into a corresponding slot 47a and each transmitting unit 43 is entirely put into the corresponding slot 47a, where the corresponding slot 47a is filled with the light-filtering molding material (step 206). Please note that the support bars 50a, 50b, 50c, 50d and the brackets 37a, 37b, 37c, 37d, 39a, 39b, 39c are utilized in co-ordination for ensuring that the transmitter components 43 of the conducting wire frame 32 and the receiver components 45 of the conducting wire frame 34 can be appropriately positioned into the corresponding granular molds 46 of the granular mold strip 36. The support bars 50a, 50b, 50c, 50d and the brackets 37a, 37b, 37c, 37d are utilized for ensuring each transmitter component 43 and each receiver component 45 are positioned in a corresponding granular mold 46 at an appropriate depth. Please note that the order of inserting the conducting wire frame 32 and the conducting wire frame 34 can be changed.

Figure 7:
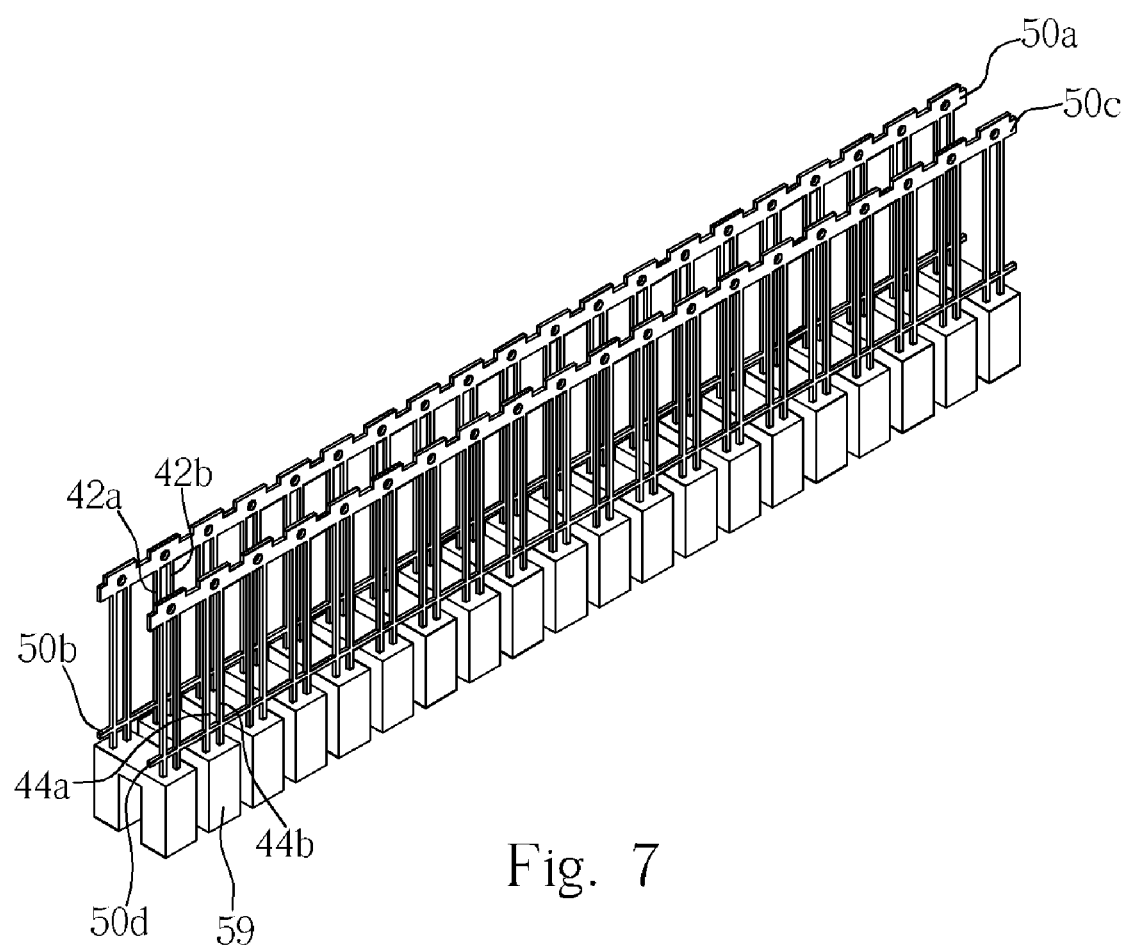
FIG. 7 is a diagram of the semi-finished product generated according to a method of the present invention.

Afterwards, the light-filtering molding material in the granular mold strip 36 is heated to speed up the solidification thereof (step 208). In other words, the time for forming the photoelectric switches is reduced via this heating procedure. Additionally, after the light-filtering molding material has been solidified, the goal of fixing the transmitting units 43 and the receiving units 45 is achieved. Next, the conducting wire frames 32, 34 and the solidified light-filtering molding material are taken from the granular mold strip 36 as a semi-finished product (step 210). Please refer to FIG. 7. FIG. 7 is a diagram of the semi-finished product generated according to a method of the present invention. Please note that the above-mentioned solidified light-filtering molding material forms the shells 59 of the plurality of photoelectric switches produced according to the present invention.

Figure 1:
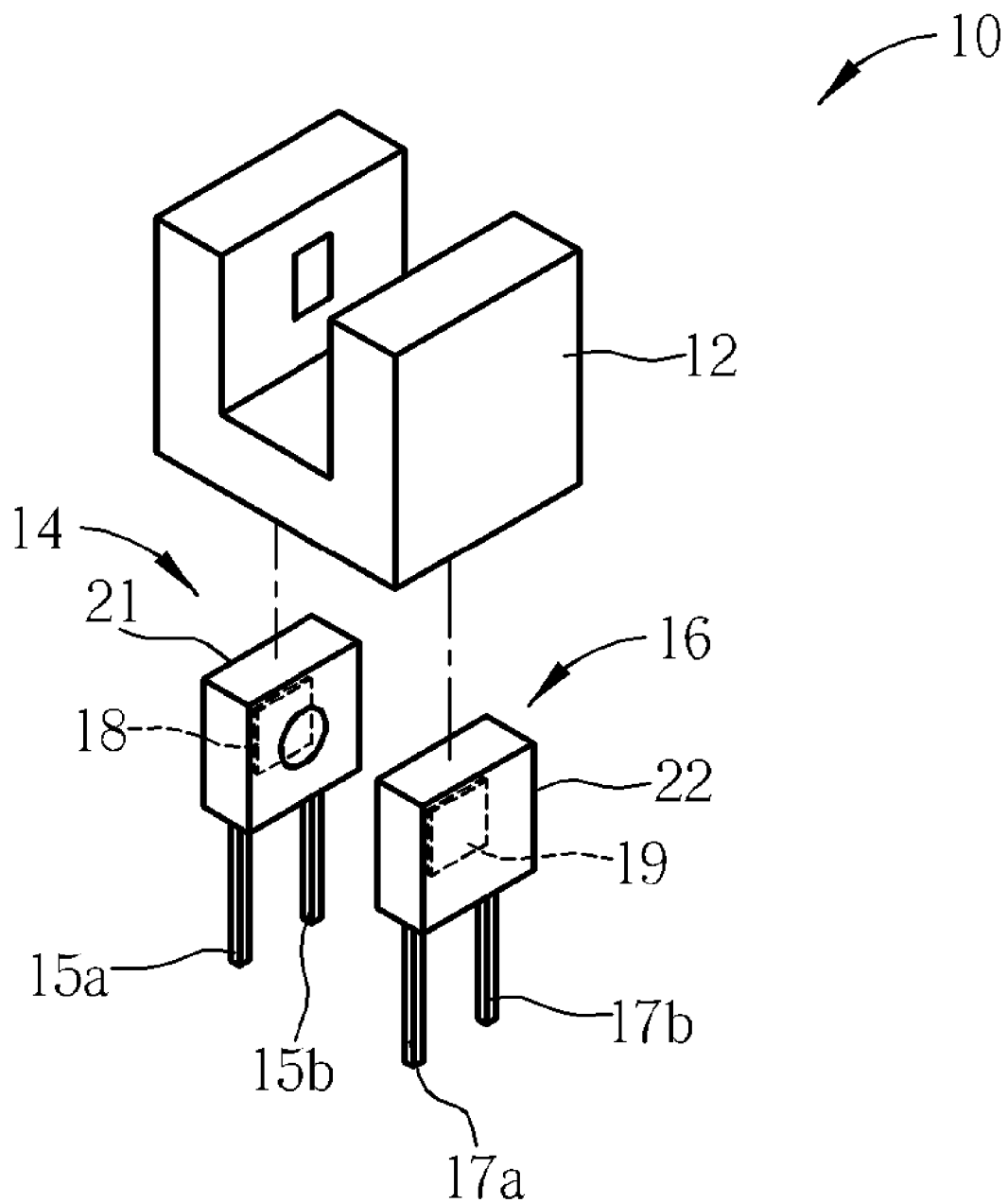
FIG. 1 is a diagram of individual components of a conventional photoelectric switch.
Figure 2:
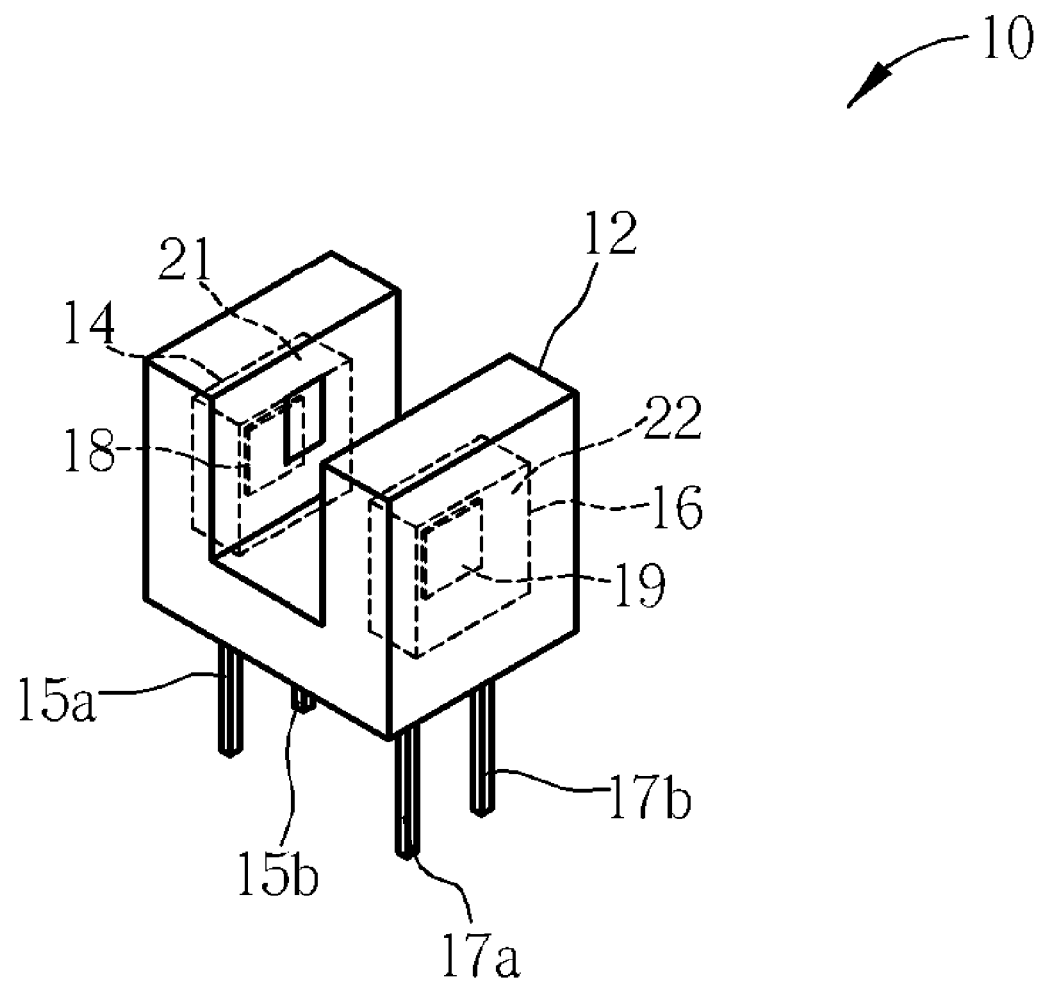
FIG. 2 is a diagram of the components shown in FIG. 1 being assembled.
Figure 8:
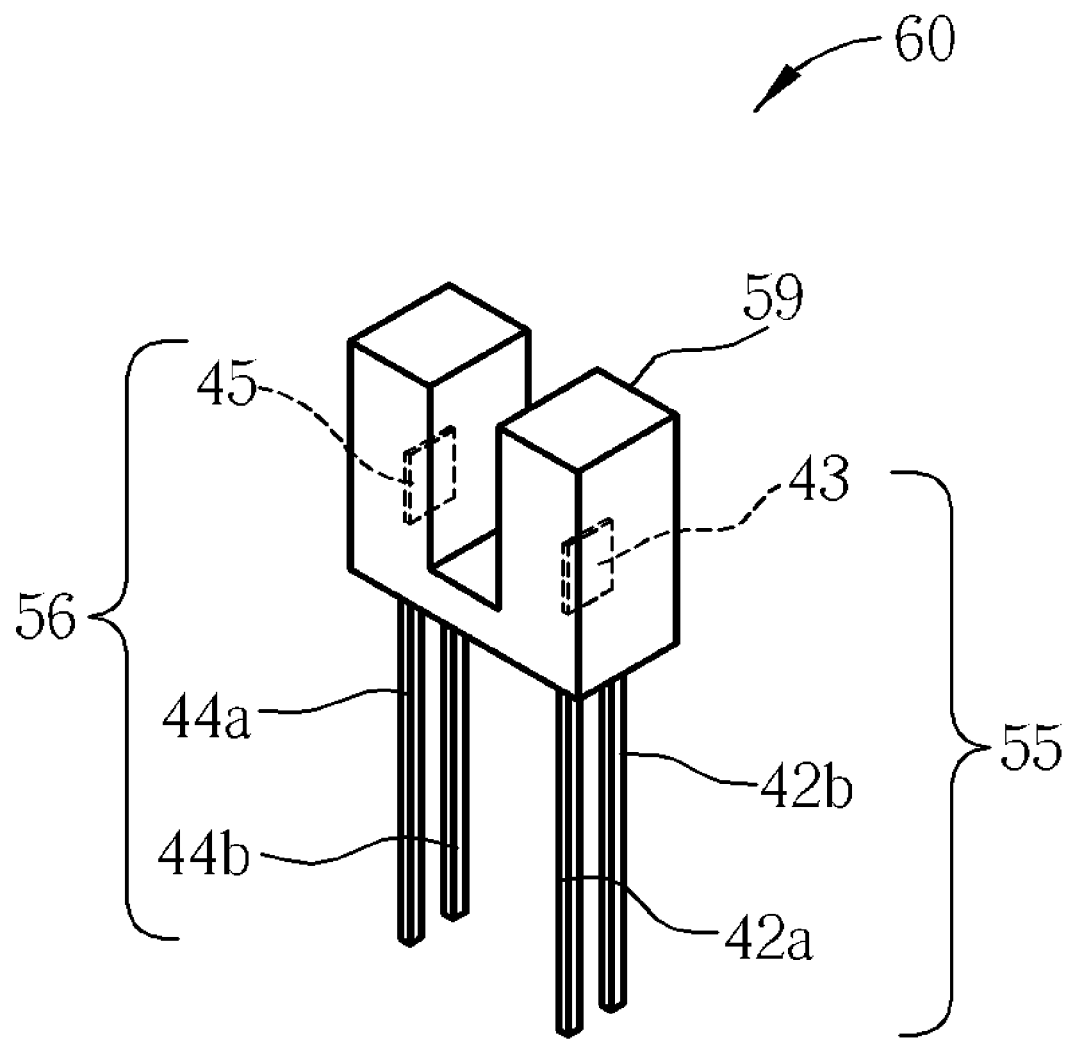
FIG. 8 is a diagram of the photoelectric switch according to the present invention.

Finally, the above-mentioned semi-finished product is delivered into a forming machine to remove the support bars 50a, 50b, 50c, 50d from the semi-finished product. The forming machine cuts the conducting wires 42a, 42b, 44a, and 44b to obtain appropriate lengths of said conducting wires 42a, 42b, 44a, and 44b. After the support bars 50a, 50b, 50c, 50d are removed, the desired photoelectric switches are formed (step 212, 214). Please refer to FIG. 8. FIG. 8 is a diagram of the photoelectric switch 60 according to the present invention. The photoelectric switch 60 comprises the transmitting unit 43, the conducting wires 42a, 42b, 44a, 44b, the receiving unit 45 shown in FIG. 4 and the shell 59 shown in FIG. 7. The transmitter component 55 is composed of the transmitting unit 43 and the pair of conducting wires 42a, 42b, and the receiver component 56 is composed of the receiving unit 45 and the pair of conducting wires 44a, 44b. The shape of the shell 59 and is the same with that of the plastic shell 12 of the photoelectric switch 10 according to the prior art shown in FIG. 1.

As mentioned above, the transmitter component 14 of the conventional photoelectric switch 10 has its own plastic shell 21, and the receiver component 16 also has its own plastic shell 22, and the transmitter component 14 and the receiver component 16 are manually installed into the plastic shell 12 of the photoelectric switch 10. In contrast with the prior art, the transmitter component 55 of the photoelectric switch 60 of this invention does not need additional shells to cover the transmitting unit 43 and to partially cover the pair of conducting wires 42a, 42b. The receiver component 56 of the photoelectric switch 60 also does not need additional shells to cover the receiving unit 45 and to partially cover the pair of conducting wires 44a, 44b. The transmitter component 55 and the receiver component 56 are directly installed in the shell 59 (the shell 59 is formed by solidifying the light-filtering molding material) according to the method of the present invention, which is an automatic process. Therefore, the forming process of the photoelectric switch can be simplified, and a large amount of photoelectric switches can be automatically produced according to the method of the present invention. The costs of labor and time and the cost of shell material(s) can be significantly reduced. Additionally, the size of the photoelectric switch formed by the automatic assembling process can become smaller. Moreover, the function of filtering out visible light is provided by the light-filtering molding material (comprising a light-filtering agent), rather than by the additional external shell of the photoelectric switch. In this way, by an appropriate selection of a light-filtering agent, the color of the shell of the photoelectric switch according to the present invention is not limited to black.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a photoelectric switch, comprising:
   (a) providing a granular mold comprising a first slot and a second slot;
   (b) providing a light-filtering molding material and filling the first and the second slots with the light-filtering molding material;
   (c) providing a transmitter component and receiver component, wherein the transmitter component comprises a transmitting unit and a first pair of conducting wires coupled to the transmitting unit, and the receiver component comprises a receiving unit and a second pair of conducting wires coupled to the receiving unit;
   (d) respectively positioning the transmitter unit and the receiver unit into the light-filtering molding material(s) in the first and the second slots, wherein the first pair of conducting wires and the second pair of conducting wires are partially put into the light-filtering molding material in the granular mold;
   (e) fixing the transmitting unit and the receiving unit to form the photoelectric switch;
   wherein while the transmitter unit and the receiver unit are being positioned into the light-filtering molding material(s) in step (d), the transmitter component has no shell covering the transmitting unit and partially covering the first pair of conducting wires, and the receiving component has no shell covering the receiving unit and partially covering the second pair of conducting wires.

2. The method of claim 1, wherein in steps (b) and (d) the light-filtering molding material is a fluid, and step (e) further comprises solidifying the light-filtering molding material to fix the transmitting unit and the receiving unit.

3. The method of claim 1, wherein the light-filtering molding material comprises an epoxy resin and a light-filtering agent.

4. The method of claim 1, wherein the light-filtering molding material is capable of filtering out visible light to prevent the transmitter component and the receiver component from passing the visible light.

5. The method of claim 1, farther comprising: solidifying the light-filtering molding material by heating.

6. A method for forming a photoelectric switch, comprising:
   providing a granular mold having a first slot and a second slot;
   filling the first and the second slots with a light-filtering molding material;
   respectively positioning a transmitter conducting wire frame which comprises a plurality of transmitting units and a plurality of pairs of conducting wires bonded with the plurality of transmitting units, and a receiver conducting wire frame which comprises a plurality of receiving units and a plurality of pairs of conducting wires bonded with the plurality of receiving units into the light-filtering molding material(s) in the first and the second slots; and
   solidifying the light-filtering molding material to form a transmitter component and a receiver component fixed in the granular mold,
   wherein the transmitter component has no shell covering the transmitting unit and partially covering the first pair of conducting wires, and the receiving component has no shell covering the receiving unit and partially covering the second pair of conducting wires.

7. The method of claim 6, wherein the light-filtering molding material is a fluid.

8. The method of claim 6, wherein the light-filtering molding material comprises an epoxy resin and a light-filtering agent.

9. The method of claim 6, wherein the light-filtering molding material is capable of filtering out visible light to prevent the transmitter component and the receiver component from passing the visible light.

10. The method of claim 6, wherein heat is applied to solidify the light-filtering molding material.

* * * * *